(12) United States Patent
Iwasaki

(10) Patent No.: US 6,201,295 B1
(45) Date of Patent: *Mar. 13, 2001

(54) PLATE-SHAPED EXTERNAL STORAGE DEVICE AND METHOD OF PRODUCING THE SAME

(75) Inventor: Hiroshi Iwasaki, Yokohama (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/933,309

(22) Filed: Sep. 18, 1997

Related U.S. Application Data

(63) Continuation of application No. 08/622,782, filed on Mar. 27, 1996, now abandoned, which is a continuation of application No. 08/205,452, filed on Mar. 4, 1994, now Pat. No. 5,552,632.

(30) Foreign Application Priority Data

Apr. 28, 1993  (JP) .................................................. 5-102884

(51) Int. Cl.⁷ ........................... H01L 23/02; H01L 23/48; H01L 23/04

(52) U.S. Cl. .......................... 257/679; 257/690; 257/693; 257/698

(58) Field of Search ................................. 257/679, 690, 257/693, 698, 727, 730, 668; 365/218, 226, 185.23, 185.18, 185.33, 185.17, 52, 185.03, 238.5, 185.22; 428/76; 235/441, 486; 361/737, 684, 686, 733; 714/7, 8, 710; 438/107, 552, 722; 348/220, 232, 231, 207; 359/152; 711/103; 360/133; 710/62, 129, 102, 113, 2

(56) References Cited

U.S. PATENT DOCUMENTS

| 4,264,917 | 4/1981 | Ugon | 257/668 |
|---|---|---|---|
| 4,703,420 | 10/1987 | Irwin | 710/113 |
| 4,837,628 | 6/1989 | Sasaki | 348/220 |
| 4,882,702 | 11/1989 | Struger et al. | 710/2 |
| 4,916,662 | 4/1990 | Mizuta | 257/668 |

(List continued on next page.)

FOREIGN PATENT DOCUMENTS

| 0 214 478 | 3/1987 | (EP) | 257/679 |
|---|---|---|---|
| 0 228 278 | 7/1987 | (EP) | 257/679 |
| 0 338 080 A1 | 8/1988 | (EP) | 257/679 |

(List continued on next page.)

OTHER PUBLICATIONS

E. Harari, Nikkei Electronics, Feb. 17, 1992, pp. 155–168.

Primary Examiner—Steven H. Loke
(74) Attorney, Agent, or Firm—Finnegan, Henderson, Farabow, Garrett & Dunner, L.L.P.

(57) ABSTRACT

An external storage device includes a storage medium series element containing at least a non-volatile memory device and external connection terminals connected to input/output terminals of the storage medium series element. An insulator molds the series element and terminals into a plate to form a plate-shaped external storage device. The terminals may be exposed in concavities or in a plane on a peripheral surface of the external storage device.

3 Claims, 5 Drawing Sheets

U.S. PATENT DOCUMENTS

| | | | |
|---|---|---|---|
| 4,943,464 | 7/1990 | Gloton et al. | 428/76 |
| 4,980,856 | 12/1990 | Ueno | 361/684 |
| 5,018,017 | 5/1991 | Sasaki et al. | 348/232 |
| 5,036,429 | 7/1991 | Kaneda et al. | 361/686 |
| 5,091,618 | 2/1992 | Takahashi | 235/441 |
| 5,153,818 | 10/1992 | Mukougawa et al. | 361/737 |
| 5,155,663 | 10/1992 | Harase | 361/684 |
| 5,172,338 | 12/1992 | Mehrotra et al. | 365/185.03 |
| 5,184,282 | 2/1993 | Kaneda et al. | 361/733 |
| 5,244,840 * | 9/1993 | Kodai et al. | 257/679 |
| 5,272,374 | 12/1993 | Kodai et al. | 257/679 |
| 5,276,317 | 1/1994 | Ozouf et al. | 235/486 |
| 5,293,236 | 3/1994 | Adachi et al. | 348/231 |
| 5,297,029 | 3/1994 | Nakai et al. | 365/238.5 |
| 5,297,148 | 3/1994 | Harari et al. | 714/710 |
| 5,299,089 | 3/1994 | Lwee | 361/684 |
| 5,309,402 | 5/1994 | Okazawa | 365/218 |
| 5,343,319 | 8/1994 | Moore | 359/152 |
| 5,375,037 | 12/1994 | LeRoux | 361/684 |
| 5,388,084 | 2/1995 | Itoh et al. | 365/185.23 |
| 5,430,859 | 7/1995 | Norman et al. | 711/103 |
| 5,438,359 | 8/1995 | Aoki | 348/207 |
| 5,457,590 | 10/1995 | Barrett et al. | 360/133 |
| 5,469,399 | 11/1995 | Sato et al. | 365/226 |
| 5,475,441 | 12/1995 | Parulski et al. | 348/552 |
| 5,488,433 | 1/1996 | Washino et al. | 348/722 |
| 5,508,971 | 4/1996 | Cernea et al. | 365/185.23 |
| 5,509,018 | 4/1996 | Niijima et al. | 714/710 |
| 5,535,328 | 7/1996 | Harari et al. | 714/7 |
| 5,550,709 | 8/1996 | Iwasaki | 361/684 |
| 5,552,632 * | 9/1996 | Iwasaki | 257/679 |
| 5,563,825 | 10/1996 | Cernea et al. | 365/185.18 |
| 5,566,105 | 10/1996 | Tanaka et al. | 365/185.22 |
| 5,568,424 | 10/1996 | Cernea et al. | 365/185.33 |
| 5,572,466 | 11/1996 | Sukegawa | 365/185.33 |
| 5,572,478 | 11/1996 | Sato et al. | 365/226 |
| 5,584,043 | 12/1996 | Burkart | 710/62 |
| 5,592,420 | 1/1997 | Cernea et al. | 365/185.18 |
| 5,596,532 | 1/1997 | Cernea et al. | 365/185.18 |
| 5,602,987 | 2/1997 | Harari et al. | 714/8 |
| 5,608,673 | 3/1997 | Rhee | 365/185.33 |
| 5,611,057 | 3/1997 | Pecone et al. | 710/102 |
| 5,615,344 | 3/1997 | Corder | 710/129 |
| 5,621,685 | 4/1997 | Cernea et al. | 365/185.18 |
| 5,638,321 | 6/1997 | Lee et al. | 365/185.17 |
| 5,663,901 | 9/1997 | Wallace et al. | 365/52 |
| 5,671,229 | 9/1997 | Harari et al. | 714/710 |
| 5,693,570 | 12/1997 | Cernea et al. | 438/107 |
| 5,887,145 | 3/1999 | Harari et al. | 710/102 |

FOREIGN PATENT DOCUMENTS

| | | | |
|---|---|---|---|
| 0 321 326 | 6/1989 | (EP) | 257/679 |
| 0 385 750 | 9/1990 | (EP) | 257/679 |
| 0 406 610 | 1/1991 | (EP) | 257/679 |
| 0 476 892 | 3/1992 | (EP) | 257/679 |
| 2 359 464 | 1/1978 | (FR) | 257/693 |
| 63-239094 | 10/1988 | (JP) | 257/693 |
| 2-22849 | 1/1990 | (JP) | 257/690 |
| 2-301155 | 12/1990 | (JP) | 257/679 |
| 3-14192 | 1/1991 | (JP) | 257/679 |
| 3-2099 | 1/1991 | (JP) | 257/679 |
| 3-109755 | 5/1991 | (JP) | 257/696 |
| 3-114788 | 5/1991 | (JP) | 257/679 |
| 4-16396 | 1/1992 | (JP) | 257/679 |
| 4-148999 | 5/1992 | (JP) | 257/679 |
| 5-134820 | 6/1993 | (JP) | 257/679 |
| 5-183094 | 7/1993 | (JP) | 257/690 |
| 6-195524 | 7/1994 | (JP) | 257/679 |
| 6-236316 | 8/1994 | (JP) | 257/679 |
| 6-318390 | 11/1994 | (JP) | 257/679 |

* cited by examiner

PLATE-SHAPED EXTERNAL STORAGE DEVICE AND METHOD OF PRODUCING THE SAME

This application is a continuation of U.S. application Ser. No. 08/622,782, filed Mar. 27 1996, now abandoned, which is a continuation of U.S application Ser. No. 08/205,452, filed Mar. 4, 1994, now U.S. Pat. No. 5,552,632.

BACKGROUND OF THE INVENTION

1. Field of the Invention

The invention relates to external storage devices capable of recording and saving various data, a method of producing the external storage devices, and an external storage device unit. More specifically, the invention relates to an external storage device exchangeably used for storage equipment and devices as an external storage medium, a method of readily producing the external storage device, and an effective utilization of the external storage device.

2. Description of the Related Art

Storage devices or memory elements, which are capable of recording and saving various data, have been utilized in two systems, In one system they are incorporated and fixed within storage equipment or devices, and in the other system they are releasably or exchangeably incorporated in the storage equipment or devices. For the external storage devices they may optionally be attached or detached or freely removed from the storage equipment or devices, for example, floppy disk devices can be attached and detached by one touch operation. Therefore, when floppy disks are the recording mediums they can separately be used, depending on the purpose and object, to record and save the data, whereby easier data reduction can advantageously be obtained.

However, a problem arises in the floppy disks described above, when the data occasionally disappears during data recording or saving producing less reliability in addition to slower access time. In addition, when producing smaller sized floppy disks in response to a miniaturization policy, a storing area of the storage medium is correspondingly smaller to reduce storage capacity, this thus limits practical use thereof.

On the other hand, semiconductor memory devices used as external storage devices such as IC memory cards can overcome the drawbacks in floppy disks, because they generally exhibit graded reliability of data recording and saving the and relatively rapid access time.

The IC memory cards comprise, a functional circuit in which circuit components containing the semiconductor memory devices or elements are mounted on substrates, a resin casing attached therein with the functional circuit as an inside attachment, a cover for coating and sealing both opening surfaces of the resin casing, and external connection terminals such as two piece connectors which are attached on one edge of the resin casing and electrically connect the functional circuit and the storage equipment/device. However, IC memory cards are assembled with a large amount of components and parts, where a relatively complicated structure is required with limitation to a thickness of the IC memory card. Further, disadvantages arise as a result of lower cost performance or production yields on mass production in addition to the lower releasability for the. storage equipment/devices or fluctuated releasability on function.

SUMMARY OF THE INVENTION

An object of the invention is to provide an external storage device formed by a simplified process.

Another object of the invention is to provide an external storage device having a high releasability with a high reliable function as an external storage medium.

Further, another object of the invention is to provide a method of producing a highly reliable external storage device with graded production yields.

Still another object of the invention is to provide an external storage device unit formed by a simplified process.

Still further, another object of the invention is to provide an external storage device unit having a high releasability with a reliable superior function as an external storage medium.

An external storage device according to the present invention is characterized by comprising, an external storage device molded into a plate shape or a card shape through coating and sealing a storage medium series element containing at least a non-volatile semiconductor memory device by using insulator, and external connection terminals connected to input/output terminals of the storage medium series element coated, incorporated by the insulator and led and exposed in a concaved or plane manner on a peripheral surface of the external storage device main.

An external storage device unit according to the invention is characterized by comprising:

an external storage device formed into a plate shape through unitarily coating and sealing the storage medium series element containing at least a non-volatile semiconductor memory device by insulator, and an external storage device having external connection terminals connected to the input/output terminals of the storage medium series element coated and incorporated unitarily by the insulator and led and exposed in concaved manner on a peripheral surface of the external storage device main; and an external storage device unit including, an engaging section contacted and engaged with a concaved surface led and exposed of at least the external connection terminals of the external storage device, and a connection section having electric contacts which are arranged on a mated contact surface of the engaging section and which are resiliently connected and disconnected from the external connection terminals depending on engaging, attaching and detaching of the external storage device for the engaging section.

Alternatively, an external storage device unit according to the invention includes:

an external storage device formed of, an external storage device main molded into a plate shape through unitarily coating and sealing an external medium series element containing at least a non-volatile semiconductor memory device by an insulator, and external connection terminals which are connected to input/output terminals of the storage medium series element coated and incorporated by the insulator and which are led and exposed on a peripheral surface of the external storage device main; and an external storage device unit main including an engaging section engaged and contacted with a surface led and exposed of at least the external connection terminals of the external storage device, a connection section having electric contacts which are arranged on a mated contact surface of the engaging section and which are resiliently connected or disconnect from the external connection terminals depending on engaging, attaching, or detaching of the external storage device to the engaging section, and a circuit having a control circuit and an interface circuit for the external storage device to be engaged, attached and detached. Here, the external storage device unit main may preferable be formed into a card shape.

A method of producing an external storage device according to the invention is characterized by comprising the steps of: process in which an external medium series element containing at least a non-volatile semiconductor memory device electrically connected with concaved type external connection terminals led outside is arranged in a splitting and assembling type mold provided on its inside walls with protruded shaped terminal protrusions respectively in corresponding to the external connection terminals led outside in way that the external connection terminals and the protruded shaped terminal protrusions opposing each other are registered;

process in which sealing resin is injected into mold arranged and registered of the storage medium series element and both the storage medium series element and the concaved type external connection terminals led outside are coated and sealed unitarily by insulative resin to be formed into a plate shape; and process in which after molding by the mold, mold pieces of splitting and assembling type are allowed to separate from a plate shaped mold state.

The present invention has cleverly been conceived in that a semiconductor memory device or element is mounted on the conventional substrate, on the other hand, the invention has been achieved in view of the fact that, when a NAND type flash memory device or element (NAND type flash E²ROM) comes to have a higher integration than DRAM (dynamic random access memory) with a capacity of 16 M-bits per chip, it can correspond to 2 M-bytes of floppy disk. In the structure of the external storage device with a plate shape or a card shape according to the invention, a part or entire of the control circuit components such as semiconductor elements forming a control function in addition to the non-volatile semiconductor memory device exhibiting a memory function, are incorporated into the plate shaped or card type external storage device to produce a build-in type.

In the external storage device according to the invention, first, a memory capacity of an extent of 16 M-bits per chip can be obtained because of a high integration, thereby the non-volatile semiconductor memory device is used as a main memory without requiring a power supply for maintaining the storage. Secondly, the main memory is made into unitary forms, the plate shape or the card type by insulative resin etc. This mold type readily provides easier handling, simplified structure in a thin shape, resulting in lower cost. In addition, the external connection terminals are provided in concaved or flat shapes to enable the mold structure of the external storage device to maintain and exhibit higher releasability for the storage equipment/device and to raise a reliability of electrical connection or disconnection due to attaching or detaching operation.

DESCRIPTION OF THE PRERERRED EMBODIMENTS

Embodiment 1

Figure 1:
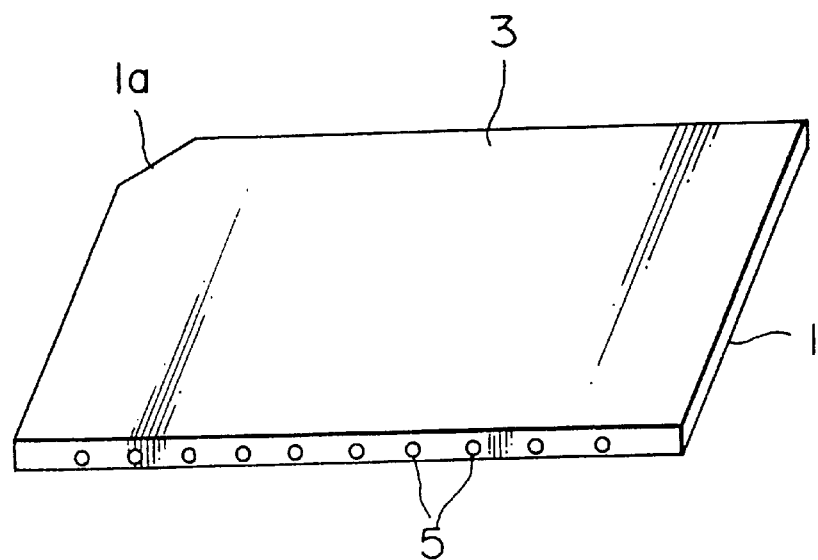
FIG. 1 is a perspective view showing essentials of an example of an external storage device according to the invention.
Figure 2:
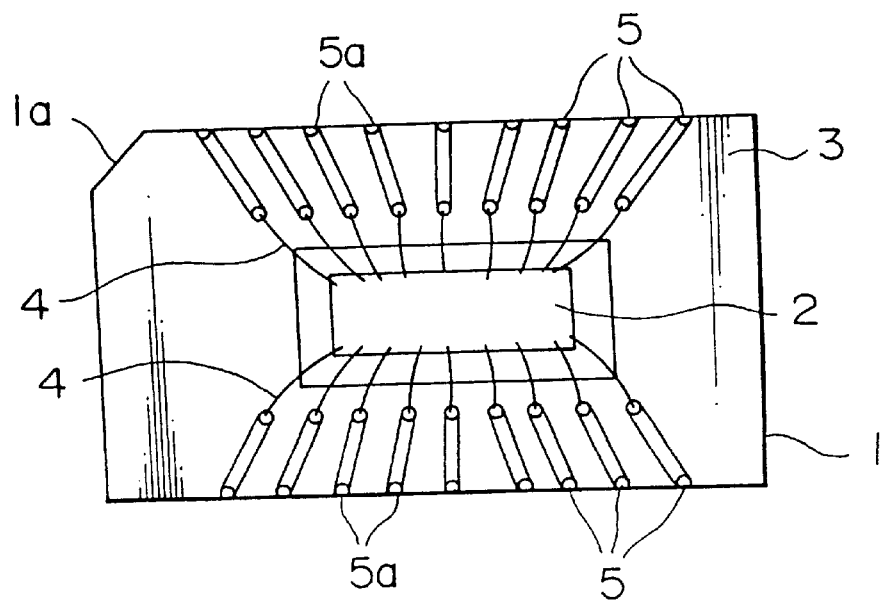
FIG. 2 is a perspective line plan view showing essentials of an example of an external storage device according to the invention.

FIG. 1 is a perspective illustration of an outline of an example of an external storage device according to the invention, and FIG. 2 is a perspective line plan view of an outline of an example of an external storage device according to the invention. In this embodiment, an external storage device 1 is configured in that a NAND type flash memory device 2 is made up on a frame substrate by a wire bonding method to produce a main body thereof sized with a length of 40 mm and a width of about 30 mm. The external storage device main is formed into a thin plate shape, coated, and mold sealed by a generally used semiconductor element molding resin such as epoxy based resin or the like. The NAND type flash memory device 2 may be bonded by a TAB (Tape Automated Bonding) system. In this embodiment, on input/output portions of the NAND type flash memory device 2, recessed external connection terminals 5 are electrically connected by a wire bonding 4. These terminals 5 are led and exposed, in a manner of slightly formed recessed surfaces 5a, on end surfaces of opposing edges in the thin plate shape by coating and sealing.

Figure 3:
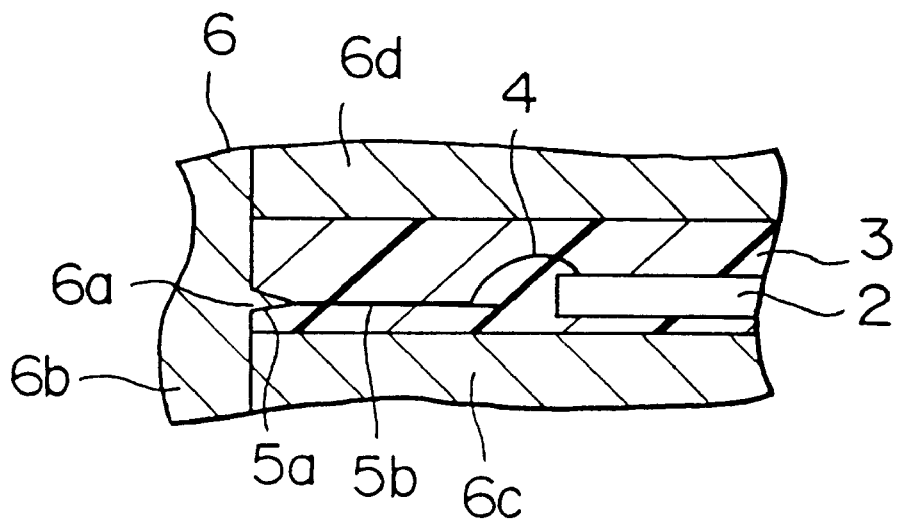
FIG. 3 is a schematic sectional view showing essentials of a preferred embodiment in producing an external storage device according to the invention.
Figure 4:
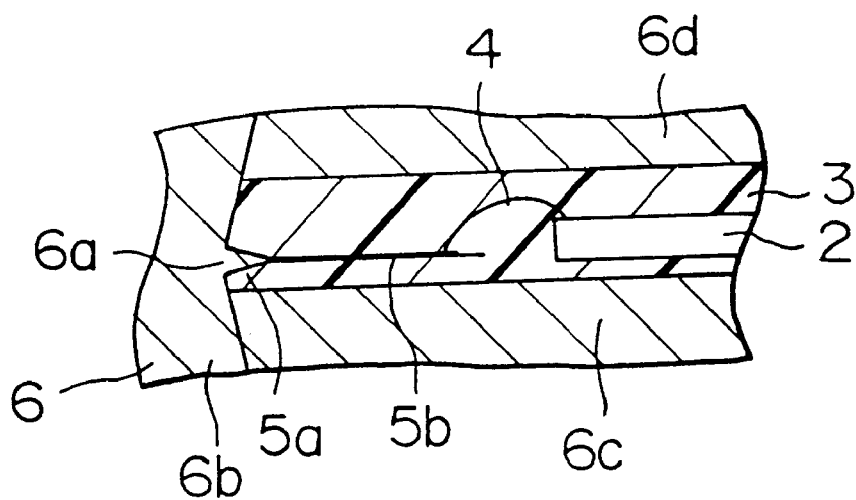
FIG. 4 is a schematic sectional view showing essentials of another preferred embodiment in producing an external storage device according to the invention.

In a method of producing the external storage device, FIGS. 3 and 4 are sectional views schematically showing a preferred embodiment of a method of producing the external storage device. First, the control proceeds to prepare the NAND type flash memory device 2 to be provided with the required external connection terminals 5. An example of this NAND type flash memory device 2 to be prepared is of a NAND type. The device 2 is assembled in that the recessed shaped external connection terminals 5 are electrically connected and led outside by a wire bonding system. The NAND type flash memory device 2 is attached on a metallic frame (not shown) and may preferably be fixed tentatively with a lead 5b which is led outside. On the other hand, the control proceeds to prepare for a disassemble type mold provided on its predetermined inside-walls with a protruded terminal shaped protrusion 6a mated with a recessed surface 5a of each recessed shaped external connection terminal 5 which is led outside, with respect to the NAND type flash memory device 2. The mold 6 is formed into a disassemble type and includes a side wall 6b formed by combining squared side-walls, a bottom wall 6c engaging and sealing squared top and bottom openings formed from the side walls 6b, and a top wall 6d. A pair of side walls 6b that oppose each other from among the side walls 6b are arranged with a group of terminal shaped protrusions 6a opposing each other for corresponding to the recessed surfaces 5a of the external connection terminals 5 of the NAND type flash memory device 2.

The disassemble type mold 6 registers, engages, and arranges the external connection terminals 5 of the NAND type flash memory device 2 with the corresponding terminal shaped protrusions 6a of the mold 6. Then if required, the NAND type flash memory device 2 is floated and positioned through supporting pieces (not shown) for the bottom walls 6c of the mold 6. A concrete example thereof includes supporting both a frame section for loading the NAND type flash memory device 2 and the external connection terminals 5 on the mold 6 by using thin frame bars. In this way, after positioning and arranging the NAND type flash memory device 2 within the mold 6, the control proceeds to inject sealing resin 3, such as epoxy resin, to coat and seal the NAND type flash memory device 2 together with the recessed shaped external connection terminals 5 in unitary shape with the insulative resin 3, and form into a plate shape. Thereafter, the walls or mold pieces 6b, 6c, and 6d of the assembled and formed mold 6 are separated from each other and from the plate shaped mold to produce the external storage device as shown in FIGS. 1 and 2.

In FIGS. 1 and 2, numeral 1a depicts a mark for indicating direction of the external storage device 1, showing the mechanical attaching and connection for the storage equipment/main and preventing or avoiding erroneous attaching. The mark 1a showing directionality is not limited to a corner section or one corner, but it may preferably be set to simultaneously provide a guide function in a detachable structure of the equipment/devices. A connection for the external connection terminals 5 of the external storage device 1 may preferable be non-contact connection systems such as radio waves or lights in addition to mechanical connections.

Embodiment 2

Figure 5:
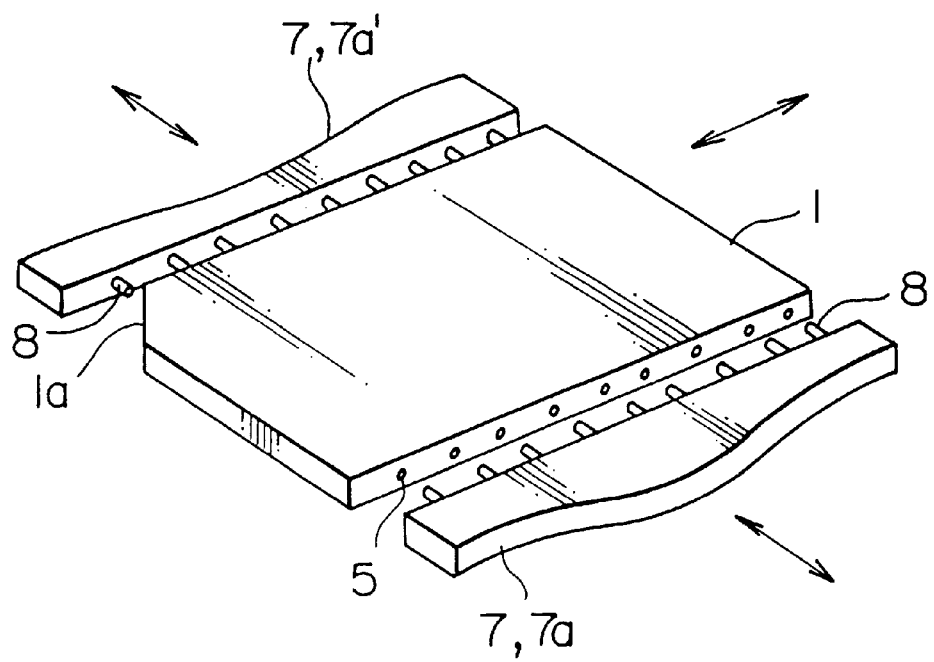
FIG. 5 is a perspective view showing a broken down example of an outline of an external storage device unit according to the invention.
Figure 6:
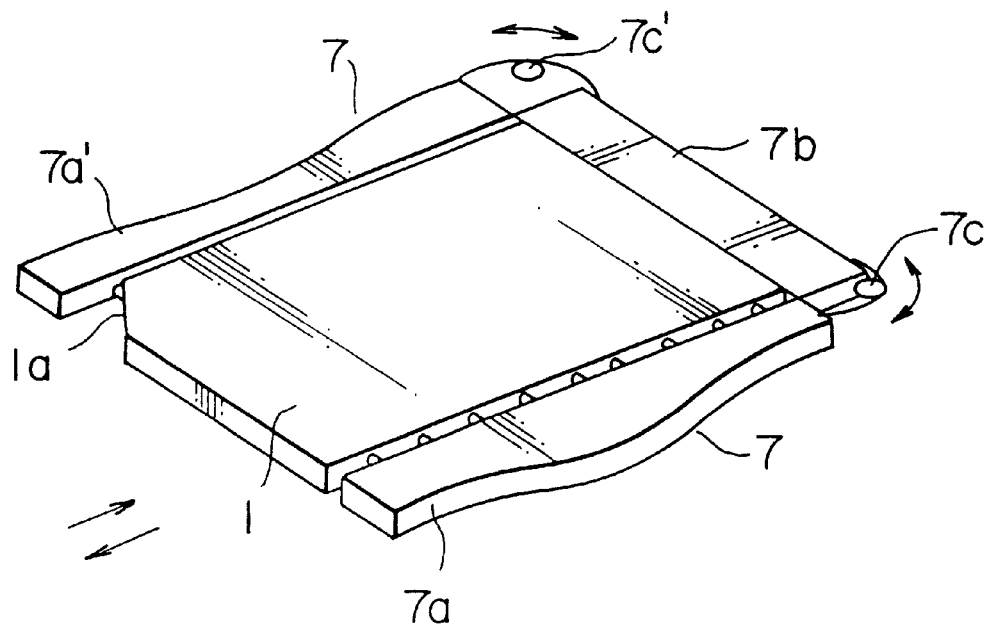
FIG. 6 is a perspective view showing a broken down example of essentials of an external storage device unit according to the invention.
Figure 7:
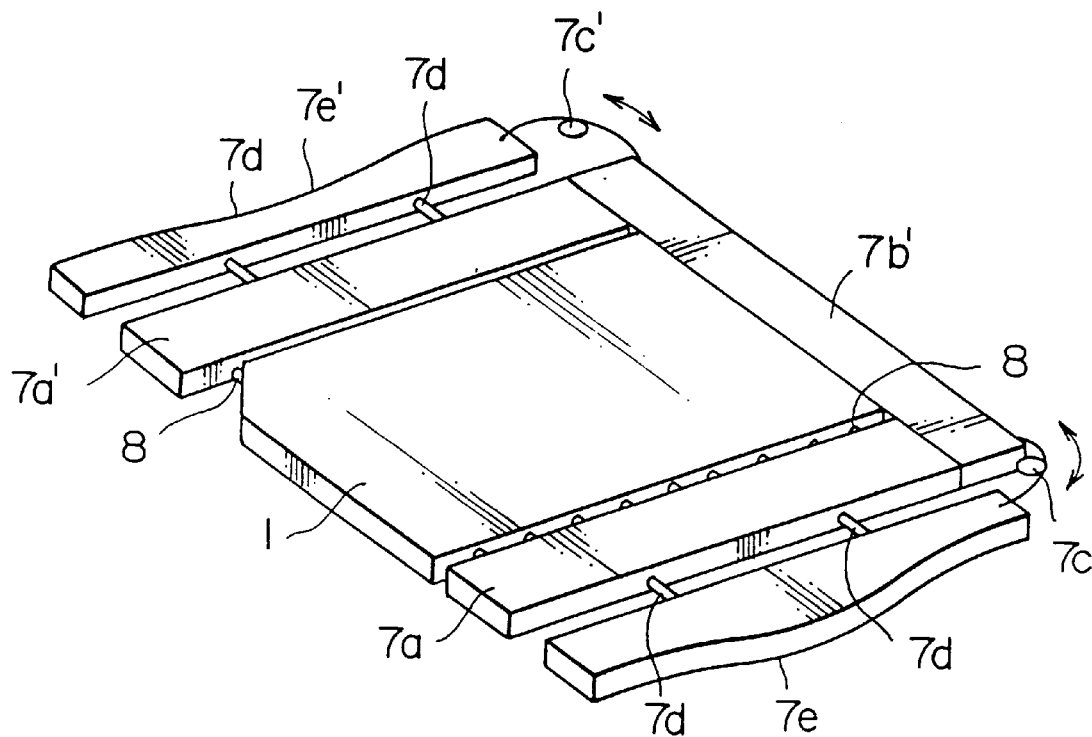
FIG. 7 is a perspective view showing a broken down example of essentials of another external storage device unit according to the invention.

FIGS. 5 to 7 are perspective views showing outlines of structures together with operation modes of an external storage device unit according to the invention. In this example, the external storage device 1 formed as described above in the embodiment 1 is in a condition having a one-side constituent element. The storage medium series element containing at least the non-volatile semiconductor memory chip 2 is coated and sealed by the insulator 3, such as epoxy resin, to be connected with the input/output terminals of both the card shape molded external storage device and the storage medium series element coated and incorporated by the insulator 3. This produces the external storage device 1 having external connection terminals 5 exposed in the manner of a concaved surface on a periphery end surface of the external storage device main, where such external storage device 1 is premised on this embodiment. As shown in FIG. 5, when inserting or extracting the external storage device 1 in or from the engage type unit 7 of the storage equipment/device main by one touch operation, depending on such insertion or extraction, the external connection terminal 5 led and exposed on opposing edges is resiliently connected to or disconnected from an electric contact 8 arranged on an engaging section of the engaging unit 7.

FIG. 6 shows in detail a structural example of the engaging unit 7, where opposing surfaces of a pair of supporters 7a and 7a', arranged to oppose each other, are engaged with end surfaces from the external connection terminals 5 of the external storage device 1 to produce a slidable form. Electric contacts 8 corresponding to the external connection terminals 5 of the external storage device 1 are electrically and insulatively arranged on a slidably formed region on the opposing surfaces of the supporters 7a and 7a'. The electric contacts 8 are electrically connected to the main body-side of the storage equipment/device and form the necessary electric circuit.

Numeral 7b depicts a slide stop member of the external storage device 1 for sliding the opposing surfaces of the pair of supporters 7a and 7a'. When the external storage device 1 is inserted and tip end thereof contacts slide stop member 7b, pin type springs 7c and 7c' rotate in a opposite directions by pressure due to such contact. By this rotation of this pin type springs 7c and 7c', this electric contacts 8 arranged on the opposing surfaces of the supporters 7a and 7a' contact with corresponding external connection terminals 5 the of thus inserted external storage device 1 to achieve necessary electrical connection. Here, an automatic fixing and setting are completed by inserting the external storage device 1 into the engaging unit 7 to attach it in a predetermined position. Depressing a push button (not shown) arranged on a main body of the unit, provides for release of a fixed engaging piece (not shown) and extraction of the external storage device 1. On releasing the fixed engaging piece, the external storage device 1 is automatically extracted by the reverse rotation of the pin type springs 7c and 7c' and the contacts of the external connection terminals 5 and the electric contacts 8 are released.

According to the invention, the engaging unit 7 is formed as developmentally shown in FIG. 7, where the pair of supporters 7a and 7a' may preferable be arranged to be movable in opposite direction through a resilient type springs 7d by a pair of cylinders 7e and 7e' respectively. Even in this structure, the electric contacts 8, which correspond to the external connection terminals 5 led and exposed on opposing end surfaces of the external storage device 1, are electrically insulated with each other and arranged on opposing surfaces of the supporters 7a and 7a'. Of course, these electric contacts 8 are electrically connected to the storage equipment/device main body side and form the necessary electric circuit. Numeral 7b' depicts an insertion stop member when the external storage device 1 is inserted. When the external storage device 1 is inserted to contact the external storage device 1 to with the insertion stop member 7b', pressure of this contact rotates the resilient type springs 7c and 7c' reverse to an energizing direction. This rotation forwards the supporters 7a and 7a' in opposite directions to press and contact the electric contacts 8 to the corresponding external connection terminals 5 of the thus inserted external storage device 1 to achieve the required electric connection. On the other hand, by when extracting the external storage device 1, the pin type springs 7c and 7c' are reversally rotated, and it is correspondingly pushed out. As is the case shown in FIG. 6, the external storage device 1 is inserted into the engaging unit 7 and attached in a predetermined position, then an automatic fixed setting is performed. On releasing the fixed setting, it is automatically pushed out by the reverse rotation of the pin type springs 7c and 7c', and the contacts of both the external connection terminals 5 and the electric contacts 8 are released.

Embodiment 3

Figure 8:
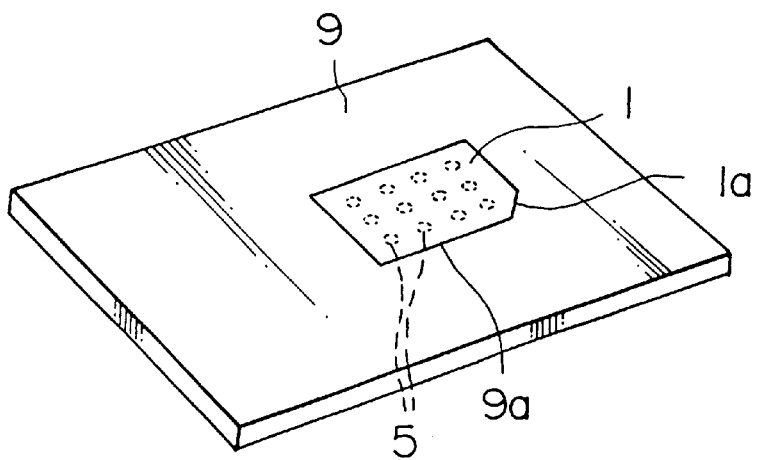
FIG. 8 is a perspective view showing an example of a different structure of an external storage device unit according to the invention.
Figure 9:
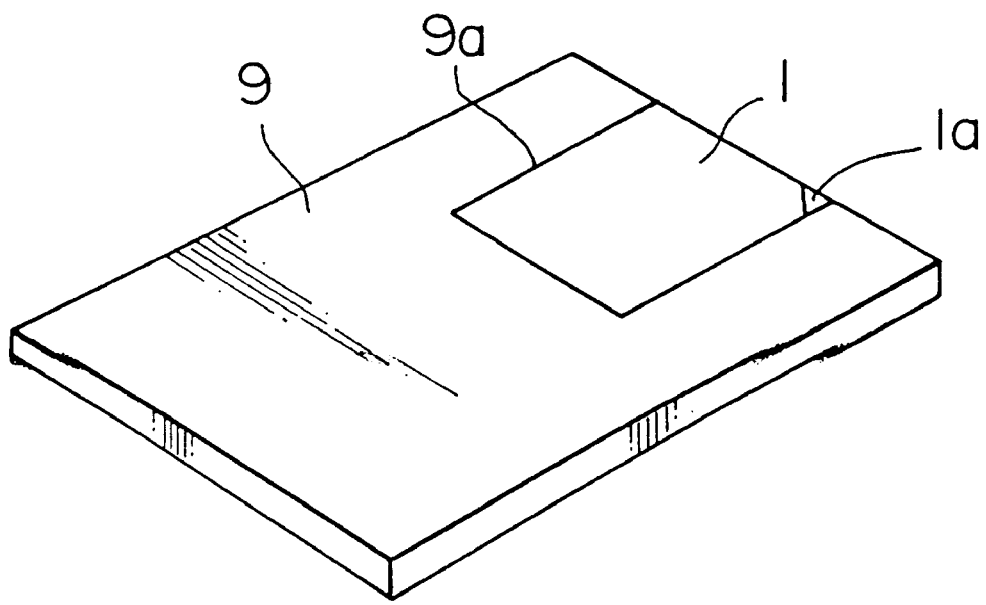
FIG. 9 is a perspective view showing an example of a further another structure of an external storage device unit according to the invention.

FIGS. 8 and 9 are perspective views showing different examples of external storage device units according to the invention respectively. In the drawings, the external storage device 1 constructed as follows is in a one-side constituent element. The storage medium series element containing at least a non-volatile semiconductor memory chip is coated and sealed by an insulator, to be connected with input/output terminals of both an external storage device main formed in a card shape and a storage medium series element incorporated with coating of the insulator. This produces an external storage device 1 having external connection terminals 5 led and exposed in a manner of a concaved or plane shape on the peripheral end surface or the main surface of the external storage device main, where such external storage device 1 is premised on this embodiment. The external storage device 1, as shown in FIGS. 8 and 9, can optionally be attached or detached to or from an external storage device unit main 9 provided with a region or window 9a capable of attaching and detaching the external storage device 1. The external storage device unit main 9 including a control device for the external storage device 1 is combined with a connection section formed of electric contacts for resiliently connecting or disconnecting to or from the external connection terminals 5 depending on whether the external storage device 1 is attatched to or from the region 9a. The region 9a is a window forming an engaging/attaching section and is detachable from the external storage device 1. As as in the other embodiments described, the external storage device 1 is engaged, attached and detached by one touch operation to and from the engaging/attaching section or region 9a of the external storage device unit main 9 to produce the required functions such as recording etc.

In the structure in FIG. 8, the electric contacts 8 corresponding to the external connection terminals 5 of the external storage device 1 are resiliently provided on the engaging/attaching section 9a of the external storage device unit main 9. On engaging, attaching and setting the external storage device 1, a pressure force thereof allows the electric contacts 8 to resiliently contact with the external connection terminals 5 led and exposed in a plane manner on the main surface (backside surface) of the external storage device 1, and such re-added pressure resets the external storage device 1. Upon detachment the electric contacts 8 are simultaneously resiliently detached from the external connection terminals 5.

In FIG. 9, when the external storage device 1 is engaged, attached, and set on the engaging/attaching section 9a of the external storage device unit main 9, the external connection terminals 5, which are placed on the end surface in the attaching or inserting direction, resiliently contact with the electric contacts 8 arranged on a contact surface of the engaging/attaching section 9a. On resetting to engage or attach the external storage device 1, engaging or hooking is released and this allows the electric contacts 8 to detach from the external connection terminals 5. If the external storage device unit main is formed into a card shape, then preferably, the external storage device unit is easy to carry as a set. The conventional card type external storage device, so called an IC memory card functions as one IC memory card such that pin connections are loaded in accordance with JEIDA (Japanese Electric Industry Development Association) or PCMCIA,(Personal Computer Memory Card International Association) or the other semiconductor devices such as interface circuits or semiconductor memory control circuits or switching circuits are loaded on the substrate. On the contrary, in the present invention only the semiconductor memory is optionally separated and used, this therefore provides a great advantage.

Preferably, the connecting section of the above embodiments includes a circuit having a memory circuit, an interface circuit, and a switching circuit for the external storage device 1.

It is understood that the invention is not limited to the embodiments as described above and in the foregoing. Various changes may be made without departing from the subject matter of the invention.

As hereinbefore fully described, in the external storage device and the external storage device unit according to the invention, various advantages are provided as listed below. For the external storage device, a high integration is provided, where the non-volatile semiconductor memory device having a larger memory capacity even in one compact chip is used as a main memory, which is molded unitarily into a card shape by insulative resin etc. Such use of the unitary mold type and the non-volatile semiconductor memory device readily provides optional detaching, easier carrying, easier handling, and thin and compact structure, thus resulting in lower cost performance. In the unitary form thereof, since the external connection terminals are made into a concaved surface or a flat surface without protruding from the coated or sealed resin layer surface, an upgraded slidability is obtained, this eliminates damage and erroneous connection of the external connection terminals.

The external storage device unit also exhibits graded releasability and improved reliability in function. In particular, various advantages in practical use of the external storage device unit include optional detaching of the external storage device, easier carrying without the possibility of damage from the outside, and a larger recording/saving capacity of the data even in a compact size.

What is claimed is:

1. A plate-shaped external storage device for recording and saving data and for use in combination with an external storage device unit main, the plate-shaped external storage device having a periphery composed of a front side, a back side, and longitudinal sides parallel to an inserting direction of the plate-shaped device into the external storage device unit main, the external storage device comprising:

a non-volatile semiconductor memory device provided with a plurality of input/output terminals;

a plurality of external connection terminals connected to the input/output terminals, the plurality of external connection terminals having end surfaces disposed on each of the longitudinal peripheral sides of the plate-shaped external storage device; and an insulator coating and sealing the memory device and the external connection terminals unitarily into a molded plate to form a plate-shaped external storage device, wherein the end surfaces of the plurality of external connection terminals are disposed on each of the longitudinal peripheral sides of the plate-shaped external storage device in concavities so as to permit attachment to and detachment from an engaging section of a connection section on the external storage device unit main, wherein the plate-shaped external storage device has a cut-off portion at a corner on the back side, the cut-off portion providing an indicating mark for an indication of an insertion direction, and wherein the plate-shaped external storage device is controlled by a control circuit.

2. An external storage device as claimed in claim 1, wherein the non-volatile semiconductor memory device is a NAND type flash memory device.

3. An external storage device as claimed in claim 1, wherein the insulator is an epoxy resin.

* * * * *

UNITED STATES PATENT AND TRADEMARK OFFICE
CERTIFICATE OF CORRECTION

PATENT NO. : 6,201,295 B1  
DATED : March 13, 2001  
INVENTOR(S) : Hiroshi Iwasaki Page 1 of 1

It is certified that error appears in the above-identified patent and that said Letters Patent is hereby corrected as shown below:

<u>Column 8, claim 1,</u>  
Line 60, after "circuit" insert -- provided in the external storage device unit main --.

Signed and Sealed this

Twenty-sixth Day of February, 2002

Attest:

*Attesting Officer*

JAMES E. ROGAN  
*Director of the United States Patent and Trademark Office*